HIGH SPEED SWITCHING TRANSISTOR AND FABRICATION METHOD THEREFOR

Filed Aug. 23, 1965

INVENTORS
OREST BILOUS
PAUL P. CASTRUCCI
TOMMY D. CLARK

BY Harry M Weiss
ATTORNEY

United States Patent Office 3,421,057

Patented Jan. 7, 1969

3,421,057

HIGH SPEED SWITCHING TRANSISTOR AND FABRICATION METHOD THEREFOR

Orest Bilous, Beacon, Paul P. Castrucci, Poughkeepsie, N.Y., and Tommy D. Clark, Ames, Iowa, assignors to International Business Machines Corporation, Armonk, N.Y., a corporation of New York Filed Aug. 23, 1965, Ser. No. 481,590

U.S. Cl. 317—235 7 Claims

Int. Cl. H01l *3/12;* H01l *7/02;* H01l *7/44*

ABSTRACT OF THE DISCLOSURE

A high speed transistor structure having a low resistivity sub-collector substrate of a first conductivity type on which a high resistivity, epitaxial collector layer of said first conductivity type is formed, a base of opposite type conductivity and an emitter of said first conductivity type being formed in said collector by double diffusion. The high resistivity collector region between the base and sub-collector has a controlled thickness equal to the depletion width in said collector at the operating voltage of the transistor. In this transistor structure, the carriers injected from the emitter through the base rapidly traverse the collector and base into the sub-collector. Thus, few majority carriers are trapped in the collector region after turn-off and delay in switching due to majority carrier storage is minimized.

This invention relates to high speed semiconductor switching devices including fabrication methods therefor, and more particularly, to high speed switching transistors including fabrication methods therefor, wherein optimum switching speeds are achieved by using precise epitaxially grown collector thickness.

In designing high speed switching transistor devices, it is essential that the total switching speed, which includes rise time, fall time, and carrier storage time, be reduced to an optimum minimum level for each selected operating voltage. The carrier storage time is the recovery time interval it takes for the carriers to be stabilized before switching the transistor off. In the "ON" state the junction between the collector and the base zone is traversed in the forward direction by current, which involves a strong injection of charge carriers into the collector zone. Before the reverse switching state, i.e. the "OFF" state, can be obtained, these charge carriers must be removed.

The lifetime of the charge carriers, especially the minority carrier lifetime, may be reduced by adding given impurities to the semiconductor material. With germanium, iron, nickel, copper and gold can be used to reduce charge carrier lifetime. For silicon, gold has been used as described in U.S. Patent 3,067,485 to D. F. Ciccolella et al., to reduce carrier lifetime in this semiconductor material. However, in order to obtain a high amplification, a long lifetime of the majority charge carriers is required, particularly in the base zone, so that it has been difficult to control the storage time of a transistor during the ON and OFF states by means of diffusing within the transistor lifetime "killers" of charge carriers.

In one previous attempt to reduce carrier lifetime, a concentration gradient of impurity atoms in the base region was employed to produce an electrostatic field which had the effect of accelerating carriers through that region. However, the problem of carrier storage in the collector region of the transistor was not solved by this prior art technique. In particular, the portion of the collector region outside of the depletion region formed by the P–N junction located between the base and collector regions was filled with majority charge carriers that did not penetrate the large potential barrier to pass into a contiguous low resistivity subcollector region when the transistor was switched off.

In U.S. Patent 3,165,811 to J. J. Kleimack et al. a transistor structure is shown and described wherein an epitaxial layer of high resistivity monocrystalline semiconductor material is grown on a low resistivity monocrystalline semiconductor base or substrate. Subsequently, base and emitter regions are diffused into the epitaxially grown layer so as to form a transistor structure having a high resistivity collector region and a low resistivity subcollector region. Variation in the thickness of the epitaxially grown film determines the ultimate thickness of the high resistivity collector region which determines the switching speed of the transistor; however, it has been discovered that only one unique or critical thickness of the high resistivity collector region will permit the transistor structure to switch on and off at optimum switching speed.

In discussing the device of this invention, the usual terminology that is well known in the transistor field will be used. In discussing concentrations, reference will be made to majority or minority carriers. By "carriers" is signified the free-holes or electrons which are responsible for the passage of current through a semiconductor material. Majority carriers are used in reference to those carriers in preponderance in the material under discussion, i.e. holes in P-type material or electrons in N-type material. By use of the terminology "minority carriers" it is intended to signify those carriers in the minority, i.e. holes in N-type material or electrons in P-type material. In the most common type of semiconductor materials used in present-day transistor structures, carrier concentration is generally due to the concentration of the "significant impurity," that is, impurities which impart conductivity characteristics to extrinsic semiconductor materials.

Although for the purpose of describing this invention reference will be made to an N-P-N configuration wherein the P region is utilized as the base region, it is to be understood that such a structure is merely illustrative and that a P-N-P structure may also be suitably adapted to the purpose of this invention.

Accordingly, it is an object of this invention to provide a very high speed switching transistor device.

It is another object to provide a method for fabricating the high speed switching transistor device of this invention.

It is a further object of this invention to provide a high speed switching transistor device utilizing a sub-collector region of low resistivity whereby the collector region located between the sub-collector region and the base region has a critical or precise thickness to permit the transistor to operate at optimum switching speeds.

It is still another object of this invention to provide a method for fabricating a high speed transistor structure incorporating a sub-collector region of low resistivity wherein the collector region located between the sub-collector region of low resistivity and the base region is formed with a critical thickness equal to the depth of the depletion region in the collector region.

In accordance with one embodiment of the invention, the transistor device comprises a semiconductor wafer having a highly doped low resistivity sub-collector region of one type conductivity. A collector region of high resistivity of the same type conductivity as the conductivity of the low resistivity region is located contiguous to the sub-collector region of low resistivity. The concentration of impurity atoms in the high resistivity collector region at the boundary with the low resistivity sub-collector region varies with respect to the concentration impurity atoms in the low resistivity region in a distance of about one micron thereby providing a sharply defined boundary. A base region of opposite type conductivity is located in the collector region of high resistivity thereby defining a P-N junction with the region of high resistivity. The depletion width in the collector region of high resistivity due to the P-N junction between the collector region of high resistivity and the base region of opposite type conductivity is substantially equal to the thickness of the portion of the region of high resistivity located between the region of low resistivity and the P-N junction. An emitter region of the same type conductivity as the collector region is disposed in the base region of opposite type conductivity. Electrical contacts are provided to at least three of the regions and preferably the sub-collector region, the base region, and the emitter region.

In accordance with another embodiment of this invention, the method for fabricating the transistor device comprises epitaxially growing a monocrystalline semiconductor layer of high resistivity of one type conductivity on a substrate of low resistivity semiconductor material of the same type conductivity. A P-N junction is formed in the epitaxial layer spaced from the low resistivity substrate by diffusing into a surface portion of the epitaxial layer a conductivity type impurity of opposite type conductivity than the conductivity type of the high resistivity layer thereby forming in the epitaxial layer a region of a conductivity type opposite that of the high resistivity layer. The thickness of a high resistivity region defined by the spaced P-N junction and the low resistivity substrate is controlled to substantially match the thickness of the depletion width in the high resistivity region as a result of the P-N junction. A conductivity type impurity of the same type conductivity as the conductivity of high resistivity layer is diffused into the region of opposite type conductivity to form therein a region of the same type conductivity as the high resistivity layer. Individual electrical connections are attached to at least three distinct active portions of the transistor.

The foregoing and other objects, features and advantages of the invention will be apparent from the following more particular description of a preferred embodiment of the invention as illustrated in the accompanying drawings.

Figure 2:
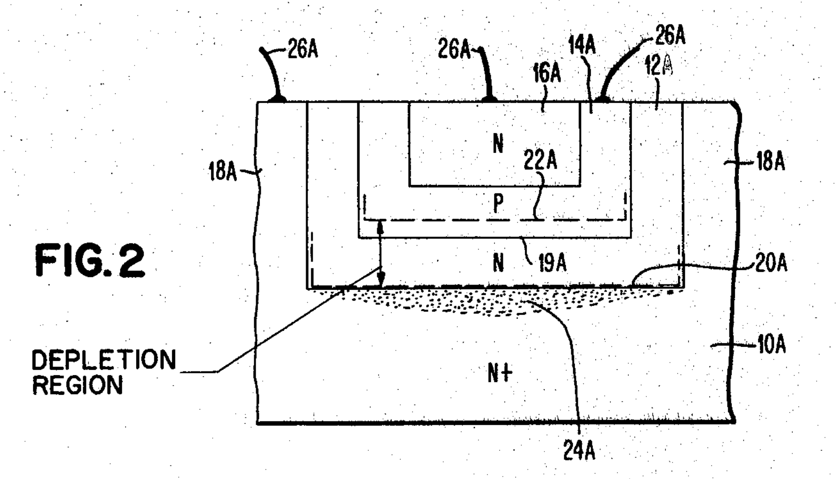
FIG. 2 is a side elevational view of the transistor structure of this invention showing the depletion region in the collector region being substantially equal to the thickness of the collector region.
Figures 3, 4:
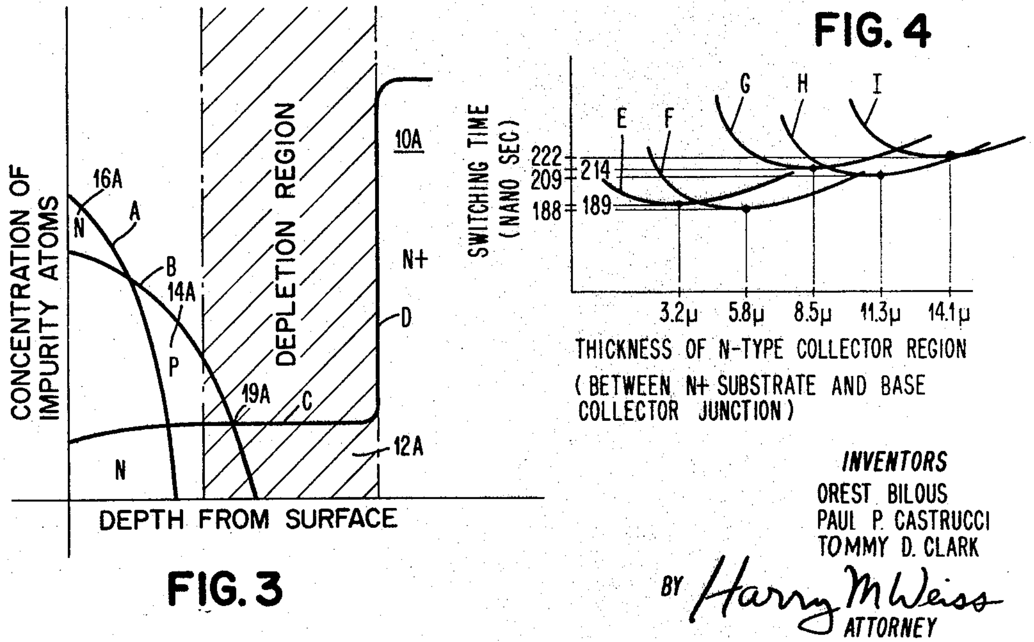

FIG. 3 is a graph showing the concentration of impurity atoms for each of the regions of the transistor of FIG. 2 in relation to the depth from the transistor surface and includes the location of the depletion region about the base-collector P-N junction; and FIG. 4 is a graph showing the optimum switching times for a number of different operating voltage parameters for the transistor of FIG. 2 in relation to each critical thickness of the collector region.

Figure 1:
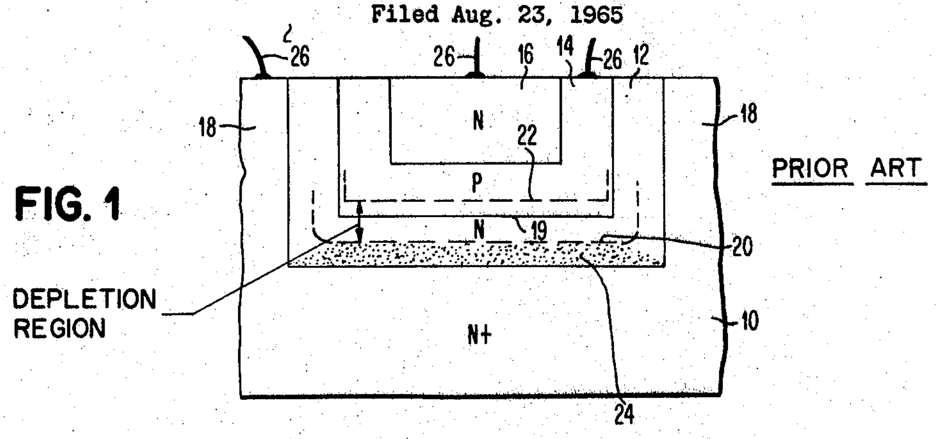
FIG. 1 is a side elevational view showing the transistor structure of the prior art and the location of the depletion region in the collector region.

Referring to FIG. 1 a substrate sub-collector region 10 of $N^+$-type conductivity is formed by conventional doping of a monocrystalline semiconductor material, such as silicon, with a high concentration of N-type impurity atoms thereby imparting to the region 10 a low resistivity which is useful in speeding up the travel time of electrons entering the sub-collector region 10. Subsequently, a monocrystalline semiconductor collector region 12 of N-type conductivity having a much lower concentration of impurity atoms than the region 10 is formed, by epitaxial growth, on the substrate region 10 of $N^+$-type conductivity. The epitaxial growth of the N-type layer or region 12 is well known and is disclosed, for example, in the publication entitled "Epitaxial Silicon Films by the Hydrogen Reduction of Silicon Tetrachloride" by H. C. Theuerer appearing in Electrochemical Society, vol. 108, p. 649, dated 1961.

By conventional diffusion techniques, a base region 14 of P-type conductivity having a higher concentration of impurities than the collector region 12 is formed in the collector region 12 of N-type conductivity, and, similarly, an emitter region 16 of N-type conductivity having a higher concentration of impurities than the base region 14 is formed within the base region 14. The $N^+$ region 10 is usually brought to the surface of the semiconductor device by conventional diffusion of $N^+$-type impurities thereby forming extension portion 18. The depletion region formed about base-collector P-N junction 19 is shown by phantom lines 20 and 22. Phantom line 20, designating the depth of the depletion region in the collector region 12, is further away from the P-N junction 19 than phantom line 22, which designates the depth of the depletion region in the base region 14, due to the higher concentration of impurities in the base region 14. However, in the operation of the prior art transistor structure shown in FIG. 1, the dotted area 24 represents the carriers that are caught in the region between the end of the depletion region 20 and the $N^+$ region 10 during the period when the transistor device is turned off. Consequently, the carrier storage lifetime causes a delay in the switching operation due to the time required for the carriers 24 to return to the base region 14. The trapped carriers 24 will not move into the $N^+$ region 10 unless bumped or accelerated therein due to a high potential field located in the region 10 caused by the excess of charge located therein. However, it is more desirable to have the carriers in the collector region 12 pass into the sub-collector region 10 which has a very low resistivity thereby permitting rapid removal of the carriers from this region. Three electrical leads 26 are provided, preferably to the $N^+$ sub-collector region 10, the base region 14, and the emitter region 16. The leads 26 are applied to the semiconductor surface by conventional techniques, such as by evaporating aluminum onto the selected portions of the silicon surface.

Referring to FIG. 2, the elements of FIG. 2 corresponding to the equivalent elements of FIG. 1 are noted in FIG. 2 with the addition of the letter A. However, in FIG. 2, the phantom line 20A designating the depth of the depletion region in the collector region 12A is now no longer located between the $N^+$ region and the base collector P-N junction, but is located substantially at the boundary line between the $N^+$ and N regions. Consequently, the majority carriers or the electrons passing from the emitter region 16A through the base region 14A will rapidly traverse the collector region 12A and pass directly into the $N^+$ region 10A.

The dotted area 24A in FIG. 2 is now shown to be in the $N^+$ region 10A. After switching the transistor off, the carriers that would have been trapped in the collector region 12 of the prior art transistor structure of FIG. 1 are now accelerated into the sub-collector region 10A of FIG. 2 due to the feature of having the depth of the depletion region in the collector region 12A substantially equal to the thickness of the collector region 12A.

Referring to FIG. 3, the ordinate axis is the concentration of impurity atoms and the abscissa axis is the distance or depth through the central portion of the surface of the transistor. Curve A represents the concentration of N-type impurity atoms that were in-diffused to form the emitter region 16A of the transistor device of FIG. 2. Curve B designates the concentration of P-type impurity atoms that were diffused into the epitaxially grown N-type layer to form the base region 14A. Curve C designates the concentration of N-type impurity atoms that were epitaxially grown on the $N^+$ type substrate 10A to form the collector region 12A. The vertical portion of Curve D indicates the abrupt transition between the N-type collector region 12A and the $N^+$-type sub-collector region 10A. A boundary distance of about one micron is the narrow sharply defined region between the $N^+$-type region 10A and the N-type region 12A. This sharply defined boundary controls the amount of spreading of the base region 14A. The depletion region is shown in FIG. 3 to have a width equal to the width of the collector region 12A.

The thickness of the N-type collector region 12A between the sub-collector region 10A and the P-N junction 19A is critical for a fixed doping of the epitaxial semiconductor material and its single optimum value for a specific open base voltage requirement is given by the following equation:

$$T_c = D_\infty\left[1+\sqrt{1-\frac{BV_s}{BV_\infty}}\right]$$

Where $T_c$ is the thickness of the N-type collector region, $D_\infty$ is the depletion width at open base breakdown in the semiconductor material having infinite epitaxial thickness, $BV_S$ is a specified open base breakdown voltage depending upon circuit requirements to insure good circuit performance, $BV_\infty$ is the open base breakdown for the same semiconductor material which, however, has an infinite N-type collector epitaxial thickness. Consequently, when $T_c$ is equal to the depletion width then $BV_S$ is equal to $BV_{CEO}$ which is the breakdown voltage between the collector and the emitter with the base open. For a fixed doping of the epitaxially grown semiconductor material, $D_\infty$ and $BV_\infty$ are constants. Hence, for a specific $BV_S$ there is only one critical value for $T_c$.

As seen below in the table, increase in $T_c$ will mean an increase in $BV_S$ with a resultant slower switching time. Therefore, it is desirable to keep $T_c$ at a minimum optimized value.

$BV_{CBO}$ value is normally two and a half to three times the $BV_{CEO}$ rating. In this example, the N-type epitaxial collector film had a critical thickness of 7.3±0.3μ that was grown on an $N^+$ substrate. The epitaxial layer has an impurity concentration of $8\times10^{14}$ atoms/cc. and a resistivity of 6 ohm-cm.

An epitaxial-type wafer with a low resistivity ($N^+$) substrate is used for several reasons. First, the bulk resistance of the collector region is very important, since a high saturation resistance will dissipate excessive power while the transistor is in the ON condition which would otherwise cause thermal runaway and eventually destroy the transistor. The $N^+$ substrate decreases this saturation resistance greatly so that the power dissipated in the collector region is small and within realistic limits.

The critical epitaxial thickness solves the problem of base widening. A charge neutralization effect takes place in the collector region next to the collector-base junction as the injected current density of the emitter becomes comparable to the collector bulk doping. The high current density passing through the collector junction neutralizes the adjacent collector region, electrically pushing the collector junction deeper into the bulk. This effect results in a wider base width and an accompanying fall in the cutoff frequency and beta. The base widening effect is decreased by using epitaxial material of critical thickness, since the base can extend to the interface of the $NN^+$ regions. But since the impurity concentration is much greater in the $N^+$ region, the injected charge cannot neutralize this region and the base width cannot expand further. Hence, it is essential that the $NN^+$ interface be

TABLE

| Epitaxial thickness | $BV_{ceo}$ (v.) | $V_{cc1}$=40 v. RL=80Ω | $V_{cc2}$=50 v. RL=100Ω | $V_{cc3}$=70 v. RL=140Ω | $V_{cc4}$=80 v. RL=160Ω | $V_{cc5}$=90 v. RL=180Ω |
|---|---|---|---|---|---|---|
| | | $t_r$-$t_f$-$t_s$ (n seconds) | $t_r$-$t_f$-$t_s$ (n seconds) | $t_r$-$t_f$-$t_s$ (n seconds) | $t_r$-$t_f$-$t_s$ (n seconds) | $t_r$-$t_f$-$t_s$ (n seconds) |
| 3.2μ (collector thickness) | 45 | 12–32–145 | | | | |
| 5.7μ (total thickness) | | 189 | | | | |
| 5.8μ (collector thickness) | 55 | 12–33–171 | 11–30–147 | | | |
| 8.3μ total thickness) | | | 188 | | | |
| 8.5μ (collector thickness) | 72 | 15–40–162 | 12–42–171 | 13–43–158 | | |
| 11.0μ (total thickness) | | | | 214 | | |
| 11.3μ (collector thickness) | 93 | 15–48–136 | 13–43–148 | 13–55–158 | 14–45–150 | |
| 13.8μ (total thickness) | | | | | 209 | |
| 14.1μ collector thickness) | 103 | 19–68–133 | 13–62–143 | 13–48–176 | 14–57–150 | 14–55–153 |
| 16.6μ (total thickness) | | | | | | 222 |

In the above table, the different operating voltages are designated by $V_{cc}$. Each load resistance is expressed as $R_L$. The total switching speed is defined as the combined total of the rise time $t_r$, fall time $t_f$ and the carrier storage time $t_s$. The decrease in storage time at greater thicknesses is explained by the fact that the tested transistors were in unequal degrees of saturation.

Referring to FIG. 4, the ordinate axis is the total switching times in nanoseconds which includes the five total times diagonally shown in the above table. The abscissa axis designates the thickness of the N-type collector region 12A between the $N^+$ substrate region 10A and the base-collector junction 19A. Accordingly, curves E, F, G, H, and I designate the characteristics of variation and clearly illustrate that there is only one critical value of collector thickness for each operating voltage $$(V_{cc1}-V_{cc5})$$

which yields a minimum or optimum switching time.

One particularly useful high speed switching transistor was designed to have a $BV_{CEO}$ (breakdown voltage between collector and emitter with base open) of greater than 45 v., for a maximum collector voltage swing of 40 v. The 40 v. collector voltage swing requires that the $BV_{CBO}$ (breakdown voltage between collector and base with emitter open) be approximately 120 v., since the abrupt as shown by the vertical line in FIG. 3 which also designates the boundary of the depletion region.

The total switching times vary for different collector thicknesses, as seen from the table, however, to meet high speed switching requirements, a transistor designed for a medium-power, double-diffused silicon driver transistors for use in 1 μsec. and 0.5 μsec. ferrite core memory circuits must be able to turn on 260 ma. of collector current in 25 nsec. and to turn off 530 ma. of collector current in 40 nsec. The storage-time specifications vary from a saturating-type operation to a non-caturating-type operation and are strongly dependent on the degree of saturation of the test.

TRANSISTOR FABRICATION

The substrate or $N^+$-type material is 0.012±0.003 ohm-cm. antimony-doped silicon. The epitaxial layer is phosphorus doped and is 7.3±0.3μ thick, as determined by chemical stain techniques. The resulting impurity concentration in the epitaxial layer is uniform and has a value of $8\pm1\times10^{14}$ cc. up to a distance of less than 1μ from the substrate. At this point, the impurity concentration changes rapidly from that of the uniformly doped epitaxial region to that of the substrate.

The epitaxial wafers are loaded into a slotted quartz boat and placed in a diffusion furnace at 970° C., where they are oxidized for 15 minutes in dry $O_2$ and for 105 minutes in steam. The resulting oxide is 6000-A. thick.

A layer of photo resist material is applied to the wafer, where it is dried, exposed, developed, and fixed. The $SiO_2$ in the base area is etched using buffered HF. The layer of photo resist material is then removed and the wafer cleaned and dried.

A boron-capsule technique is used for the base diffusion. The wafers, placed in contact with each other between two quartz plugs, are sealed in an evacuated quartz capsule along with a powdered boron-silicon source, preferably of any suitable boron-silicon alloy. After the capsule is sealed, it is placed in a diffusion furnace for 35 minutes at 1108° C.

An oxidation drive-in is used to grow 3500 A. of $SiO_2$ in the base region and to redistribute the boron, increasing the junction depth and lowering the $C_0$ (concentration). The wafers are cleaned by scrubbing with acetone and microcloth, followed by a rinsing in running distilled water. The purpose of this cleaning is to remove any particles of silicon powder that may have settled on the wafer during deposition. The wafers are then loaded in a slotted oxidation boat in a clean atmosphere. The boat is placed in a diffusion furnace at 1150° C. for 30 minutes in dry $O_2$ and for 10 minutes in steam.

At this point, the wafers are prepared for gold evaporation by removing the oxide from the backs of the wafers. This is conveniently done by holding the wafers with tweezers and directing a blast of nitrogen-propelled alumina abrasive onto the back of the wafer. No masking is necessary to protect the front of the wafer, and no support other than tweezers is needed. The wafers are then cleaned with acetone and microcloth and rinsed in deionized water.

The wafers are placed in a hemispherical evaporation jig in a bell jar. The jar is evacuated, and 1700 A. of gold are evaporated onto the backs of the wafers. The gold is then alloyed with the silicon by placing the wafers in a diffusion furnace at 970° C. in a $N_2$ atmosphere for 10 minutes.

The wafers are placed in a slotted quartz boat and transferred to a diffusion furnace at 1150° C., where gold is diffused therein for 15 minutes in an $N_2$ atmosphere. The gold diffusion operation is useful in introducing impurities in the semiconductor material which will reduce minority carrier lifetime.

A layer of photo resist material is applied to the wafer, dried, exposed, developed, and fixed. The $SiO_2$ film in the emitter area is etched using buffered HF. The layer of photo resist material is then removed, and the wafer is cleaned and dried.

A $PH_3$ diffusion process is used for the emitter diffusion. The wafers are loaded into a slotted quartz boat and placed in a diffusion furnace at 925° C. The input gases to the system consist of $O_2$, $PH_3$, and $N_2$, where the $PH_3$ concentration is 1280 p.p.m., the $O_2$ flow rate is 200 cc./min. and the $N_2$ flow rate is 2600 cc./min. The deposition time is 60 minutes.

The wafers are once again loaded into a slotted quartz boat and placed in a diffusion furnace at 970° C. They are oxidized in dry $O_2$ for 5 minutes, steam for 40 minutes, and dry $O_2$, again for 5 minutes.

FINAL TRANSISTOR STRUCTURE

Collector depth=0.100±0.003 mil
Emitter depth=0.047±0.002 mil
Base width=0.053±0.005 mil
Base $C_0=8\times10^{18}$ cm.$^{-3}$
Emitter $C_0=8\times10^{20}$ cm.$^{-3}$
Boron $B_s$=160±15 ohm/cm.
Phosphorus=7±1 ohm/cm.
$SiO_2$ thickness:
E-B junction=5760 A.
C-B junction=7820 A.

In order to form contacts, the oxide is removed in selected areas of the device, exposing silicon, to allow for ohmic contacts. This is accomplished by standard photolithographic masking and etching techniques using a layer of thin film photo resist material. Aluminum ohmic contacts are produced by evaporating a layer of aluminum over the entire wafer surface and subtractively removing it to produce the desired contact pattern. 6500 A. of aluminum are evaporated onto the wafer at a surface temperature of 200° C. and a vacuum pressure of $5\times10^{-6}$ Torr. A layer of thin film photo resist material is applied to the wafer, dried, exposed, developed, and fixed. The aluminum contacts are subtractively etched using a warm solution of $H_3PO_4+HNO_3+H_2O$. The layer of thin film photo resist material is removed and the wafer is cleaned and dried.

The wafers are sintered in a nitrogen atmosphere at 440° C. for 10 minutes to produce good ohmic contact.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A transistor device comprising, in combination:
a semiconductor wafer having a highly doped low resistivity region of one type conductivity;
a region of high resistivity of the same type conductivity as said low resistivity region located contiguous to said region of low resistivity, the concentration of impurity atoms in the high resistivity region at the boundary with the low resistivity region varies with respect to the concentration of impurity atoms in the low resistivity region in a distance of about one micron thereby providing a sharply defined boundary;
a region of opposite type conductivity located in said region of high resistivity, said region of opposite type conductivity defining a first P-N junction with said region of high resistivity, the depletion width in the region of high resistivity at operating voltage being substantially equal to the thickness of the portion of the region of high resistivity located between the region of low resistivity and the first P-N junction;
a region of said one type conductivity disposed in said region of opposite type conductivity, said region of one type conductivity defining a second P-N junction with said region of opposite type conductivity, the depletion width from said first junction in said region of opposite conductivity at operating voltage being less than the thickness of hte region of opposite type conductivity located between said first and second P-N junctions; and
electrical contacts provided to at least three of said regions.

2. A transistor device in accordance with claim 1, in which said region of low resistivity being a sub-collector, said region of high resistivity being a collector, said region of opposite type conductivity being a base, and said region of said one type conductivity disposed in said region of opposite type conductivity being an emitter.

3. A transistor device in accordance with claim 2, in which the thickness of said collector located between said base and said sub-collector being defined by the following equation:

$$T_c=D_\infty\left[1+\sqrt{1-\frac{BV_s}{BV_\infty}}\right]$$

where $T_c$ is the thickness of the collector, $D_\infty$ is the depletion width at open base breakdown of the semiconductor material having infinite thickness, $BV_s$ is the specified open base breakdown voltage depending upon circuit requirements to insure good circuit performance, $BV_\infty$ is the open base breakdown for the same semiconductor material which has an infinite collector thickness.

4. A transistor device in accordance with claim 3, in which said sub-collector being of $N^+$-type conductivity, said collector being of N-type conductivity, said base being of P-type conductivity, and said emitter being of N-type conductivity.

5. A method for fabricating a transistor device comprising the steps of:

epitaxially growing a monocrystalline semiconductor layer of high resistivity of one type conductivity on a substrate of low resistivity semiconductor material of the same type conductivity;

forming a first P-N junction in said epitaxial layer spaced from said low resistivity substrate by diffusing into a surface portion of the epitaxial layer a conductivity type impurity for forming in said layer a region of a conductivity type opposite that of said one type conductivity;

controlling the thickness of a high resistivity region of said epitaxial layer located between said first P-N junction and said low resistivity substrate to substantially match the thickness of the depletion width in said high resistivity region at the operating voltage;

diffusing a conductivity type impurity of the same type conductivity as said one type conductivity into the region of opposite type conductivity for forming in said region of opposite type conductivity a region of said one type conductivity, said region of one type conductivity defining a second P-N junction with said region of opposite type conductivity;

controlling the thickness of said region of opposite type conductivity between said first and second junctions to be less than the thickness of the depletion width from said first junction in said region of opposite type conductivity at the operating voltage; and attaching individual electrical connections to at least three distinct active portions of the transistor.

6. The method of claim 5, in which the boundary between said high resistivity epitaxially grown layer containing relatively low concentrations of impurities and said low resistivity substrate region containing relatively high concentrations of impurities being sharply defined and about one micron thick.

7. The method of claim 5, further characterized by the step of introducing minority carrier lifetime killing impurities into said transistor.

References Cited

UNITED STATES PATENTS

| | | | |
|---|---|---|---|
| 2,767,358 | 10/1956 | Early | 317—239 |
| 3,165,811 | 1/1965 | Kleimack et al. | 29—25.3 |
| 3,319,138 | 5/1967 | Bergman et al. | 317—235 |

JOHN W. HUCKERT, *Primary Examiner.*

R. F. POLISSACK, *Assistant Examiner.*

U.S. Cl. X.R.

317—234; 29—569, 576, 589; 148—186, 187

UNITED STATES PATENT OFFICE
CERTIFICATE OF CORRECTION

Patent No. 3,421,057 January 7, 1969

Orest Bilous et al.

It is certified that error appears in the above identified patent and that said Letters Patent are hereby corrected as shown below:

Column 2, line 68, after "concentration" insert -- of --. Column 3, line 31, after "of", second occurrence, insert -- the --. Column 5, between lines 10 and 12, the formula should appear as shown below:

$$T_c = D_\infty \left[ 1 + \sqrt{1 + \frac{BV_s}{BV_\infty}} \right]$$

same column 5, in the TABLE, the column heading for (n seconds), each occurren should read $$t_r - t_f - t_s$$

Column 6, line 60, "non-caturating type" should read -- non-saturating type --. Column 8, line 52, "hte" should read -- the --; between lines 66 and 70, the formula should appear as shown below:

$$T_c = D_\infty \left[ 1 + \sqrt{1 + \frac{BV_s}{BV_\infty}} \right]$$

Signed and sealed this 31st day of March 1970.

(SEAL)
Attest:

EDWARD M.FLETCHER,JR.
Attesting Officer

WILLIAM E. SCHUYLER, JR.
Commissioner of Patents